(12) United States Patent
Oh et al.

(10) Patent No.: US 11,289,633 B2
(45) Date of Patent: Mar. 29, 2022

(54) LED ARRAY PACKAGE AND MANUFACTURING METHOD THEREOF

(71) Applicant: LUMENS CO., LTD., Yongin-si (KR)

(72) Inventors: Seung Hyun Oh, Yongin-si (KR); Jung Hyun Park, Yongin-si (KR); In Yeol Hong, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 95 days.

(21) Appl. No.: 16/690,061

(22) Filed: Nov. 20, 2019

(65) Prior Publication Data

US 2020/0287110 A1    Sep. 10, 2020

(51) Int. Cl.
*H01L 33/62* (2010.01)
*H01L 33/00* (2010.01)
*H01L 25/075* (2006.01)

(52) U.S. Cl.
CPC .......... *H01L 33/62* (2013.01); *H01L 25/0753* (2013.01); *H01L 33/0095* (2013.01); *H01L 2933/0066* (2013.01)

(58) Field of Classification Search
CPC . H01L 33/62; H01L 25/0753; H01L 33/0095; H01L 2933/0066; H01L 33/36; H01L 33/54; H01L 21/31051; H01L 21/304
See application file for complete search history.

(56) References Cited

U.S. PATENT DOCUMENTS

| 2008/0173884 A1* | 7/2008 | Chitnis | H01L 33/508 |
| | | | 257/98 |
| 2017/0077367 A1* | 3/2017 | Shimojuku | H01L 33/44 |

* cited by examiner

*Primary Examiner* — Kyoung Lee
(74) *Attorney, Agent, or Firm* — Mei & Mark LLP

(57) ABSTRACT

The present invention relates to a micro Light Emitting Diode (LED) matrix array package, including: a plurality of light emitting devices including a base substrate and a semiconductor laminated layer formed on the base substrate; a plurality of solder balls formed on the semiconductor laminated layer of the plurality of light emitting devices, respectively; a molding member configured to surround the light emitting devices and the solder balls; and a circuit board formed on the molding member, in which upper surfaces of the solder balls are exposed from the molding member, the circuit board includes a contact layer consisted of a metal pattern layer electrically connected with the plurality of solder balls exposed from the molding member and an insulating layer adjacently disposed to the metal pattern layer, and a thickness from the base substrate of each of the plurality of light emitting devices to an upper surface of each of the exposed solder balls is the same each other.

15 Claims, 15 Drawing Sheets

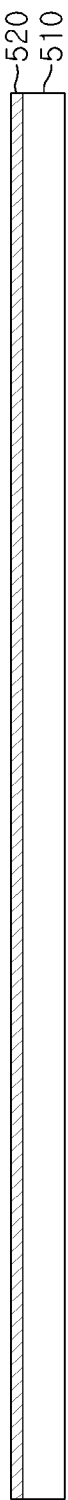

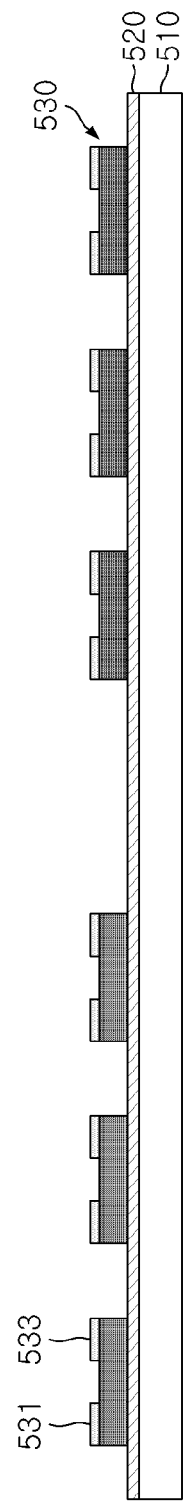

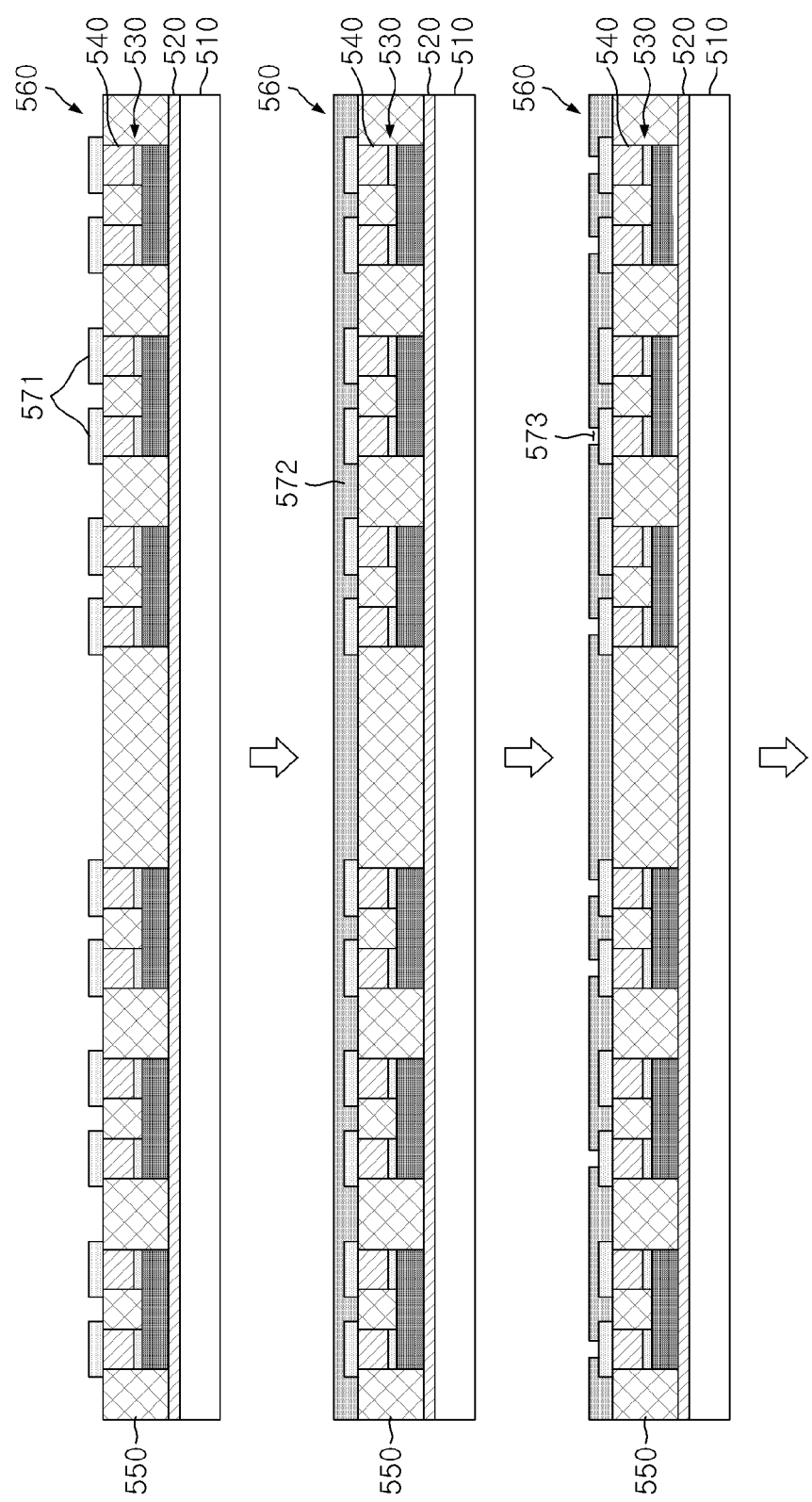

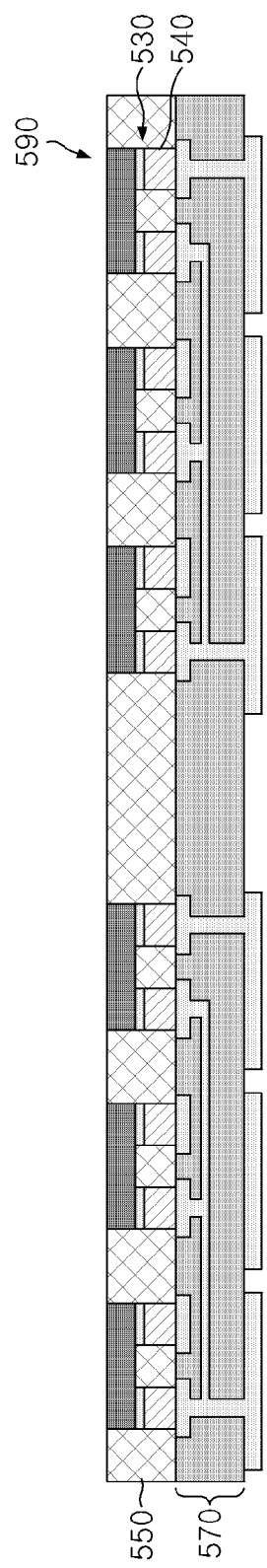

LED ARRAY PACKAGE AND MANUFACTURING METHOD THEREOF

CROSS-REFERENCE TO RELATED APPLICATIONS

This application claims priority to Korean Patent Application No. 10-2019-0025251 filed on Mar. 5, 2019 in the Korean Intellectual Property Office, the entire contents of which are incorporated herein by reference.

BACKGROUND OF THE INVENTION

Field of the Invention

The present invention relates to a Light Emitting Diode (LED) array package and a method of manufacturing the same, and more particularly, to an LED array package, in which it is possible to effectively remove tilting of a plurality of light emitting devices mounted onto a package body and steps between the light emitting devices, and a method of manufacturing the same.

Description of the Related Art

A light emitting diode (LED) is a sort of semiconductor device which converts electric energy to light energy. The LED has advantages in low power consumption, semi-permanent life, high response speed, safety, and eco friendliness, compared to an existing light source, such as fluorescent light and incandescent light.

In this respect, a lot of research on replacement of the existing light source with the LED has been conducted, and there increases the case in which the LED is used as a light source of a lighting device, such as various lamps used in indoor and outdoor places, a liquid crystal display device, an electronic display, and a streetlamp.

Recently, an LED industry makes a new attempt to be applied to various industries beyond an existing traditional lighting range, and particularly, research is actively conducted in a low power driven flexible display field, an attachment-type information display device field for monitoring a human body, a vital reaction and deoxyribonucleic acid (DNA) sensing field, a bio convergence field for verifying effectiveness of optogenetics, and a photonics textile field in which a conductive fiber is combined with an LED light source.

In general, when an LED chip is fabricated in a size of several to several tens of micrometer which is small, it is possible to overcome a disadvantage in that the LED chip is broken when an inorganic material is bent according to a characteristic of the inorganic material, and it is possible to broadly apply the LED chip to various application fields up to a wearable device and a medical device for body insertion, as well as the foregoing flexible display, by giving flexibility by transferring the LED chip to a flexible substrate. However, in order to apply the LED light source to the foregoing application fields, it is necessary to develop a light source which is thin and flexible, and has a size in a micrometer level, and there is a need for a process of precisely transferring a plurality of LED light sources on a flexible substrate separately or in a desired arrangement.

In the meantime, in the case where small LED chips at the micrometer level are manufactured through a wafer process, a scribing process of scribing a sapphire substrate, which is a growth substrate of the LED chips, to a predetermined thickness is performed. However, by the scribing process, a predetermined height deviation is incurred between the LED chips. When the LED chips having the height deviation are mounted onto one package, there is a problem in that a step is generated between the LED chips.

When the small LED chips at the micrometer level are mounted onto one package, in order to enable the LED chips to be individually driven, a precise bonding process is required between each of the LED chips and a package body. However, there is a problem in that due to difficulty in the precise bonding process, a predetermined step is generated between the LED chips or a tilting phenomenon occurs in the LED chips. When a display panel is implemented by using an LED array package including the LED chips having the tilting and step problems, chromatic aberration is caused to degrade resolution and high color reproduction of the corresponding display panel.

When a plurality of micro LED chips is mounted onto an existing Printed Circuit Board (PCB) substrate, there is a problem in that there is a limit in a design of the PCB substrate by a minimum pitch gap between the LED chips. Further, when the plurality of micro LED chips is mounted onto the existing PCB substrate, the number (4 to 6) of layers of the PCB substrate increases, and thus there is a problem in increasing cost according to an increase in process cost. Further, when the existing PCB substrate is used for implementing a circuit for individually driving the plurality of micro LED chips, there is difficulty in decreasing a width of an electrode and a width between the electrodes.

BRIEF SUMMARY OF THE INVENTION

An object of the present invention is to solve the foregoing problems and other problems. Another object of the present invention is to provide a Light Emitting Diode (LED) array package formed so that light emitting surfaces of a plurality of light emitting devices mounted onto a package body are located on the same horizontal surface, and a method of manufacturing the same.

Another object of the present invention is to provide an LED array package, in which it is possible to effectively remove tilting of a plurality of light emitting devices and a step between the light emitting devices by using a semiconductor planarizing process, and a method of manufacturing the same.

An exemplary embodiment of the present invention provides a light emitting diode (LED) array package, including: a plurality of light emitting devices including a base substrate and a semiconductor laminated layer formed on the base substrate; a plurality of solder balls formed on the semiconductor laminated layer of the plurality of light emitting devices, respectively; a molding member configured to surround the light emitting devices and the solder balls; and a circuit board formed on the molding member, in which upper surfaces of the solder balls are exposed from the molding member, the circuit board includes a contact layer consisted of a metal pattern layer electrically connected with the plurality of solder balls exposed from the molding member and an insulating layer adjacently disposed to the metal pattern layer, and a thickness from the base substrate of each of the plurality of light emitting devices to an upper surface of each of the exposed solder balls is the same each other.

Another exemplary embodiment of the present invention provides a method of manufacturing an LED array package, the method including: arranging a plurality of light emitting devices including a base substrate and a semiconductor laminated layer formed on the base substrate on an adhesive member attached to an upper surface of a transparent plate member; forming a plurality of solder balls on the semiconductor laminated layers of the light emitting devices; forming a molding member on the adhesive member so as to surround lateral surfaces and upper surfaces of the light emitting devices and the solder balls; and performing a planarizing process of grinding or polishing upper portions of the molding member and the plurality of solder balls, in which the planarizing process is performed so that the upper surfaces of the solder balls are exposed from the molding member, and a thickness from the base substrate of each of the plurality of light emitting devices to an upper surface of each of the exposed solder balls is the same each other.

BRIEF DESCRIPTION OF THE DRAWINGS

FIGS. 5A to 5I are diagrams illustrating a method of manufacturing an LED array package according to an exemplary embodiment of the present invention.

DETAILED DESCRIPTION OF THE INVENTION

Figure 1:
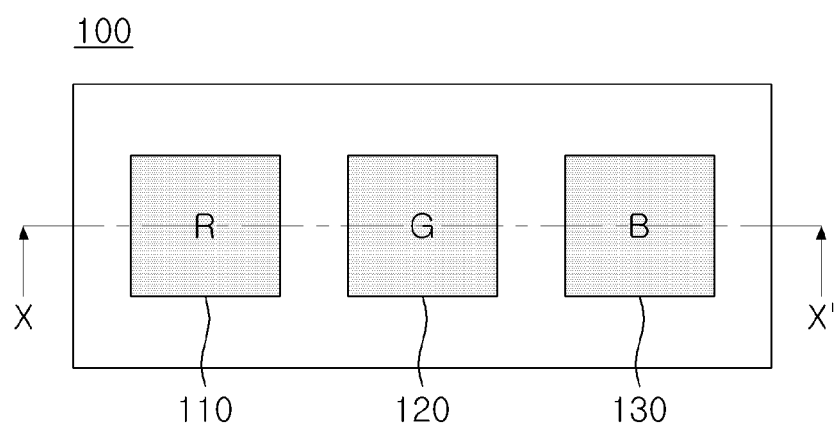
FIG. 1 is a top plan view of a Light Emitting Diode (LED) array package according to an exemplary embodiment of the present invention.

Hereinafter, exemplary embodiments disclosed in the present specification will be described in detail with reference to the accompanying drawings, and the same or similar constituent elements are denoted by the same reference numerals regardless of a sign of the drawing, and repeated description thereof will be omitted. Hereinafter, in the description of the exemplary embodiments of the present invention, a case where each layer (film), a region, a pattern, or structures are formed "on" or "under" a substrate, each layer (film), a region, a pad, or patterns includes all of the cases in which each layer (film), the region, the pattern, or the structures are directly formed "on" or "under" the substrate, each layer (film), the region, the pad, or the patterns, or intervening layers are present. Further, a reference of "on" or "under" each layer is described with reference to the drawings. In the drawings, for convenience and clearness of description, a thickness or a size of each layer is exaggerated, omitted, or schematically illustrated for convenience and clarity of the description. Further, a size of each constituent element does not totally reflect an actual size.

In describing the exemplary embodiments disclosed in the present specification, a detailed explanation of known related technology may be omitted so as to avoid obscuring the subject matter of the exemplary embodiments disclosed in the present specification. Further, the accompanying drawings are provided for helping easy understanding of the exemplary embodiments disclosed in the present specification, and the technical spirit disclosed in the present specification is not limited by the accompanying drawings, and it will be appreciated that the present invention includes all of the modifications, equivalent matters, and substitutes included in the spirit and the technical scope of the present invention.

The present invention suggests a Light Emitting Diode array package formed so that light emitting surfaces of a plurality of light emitting devices mounted onto a package body are located on the same horizontal surface, and a method of manufacturing the same. Further, the present invention suggests an LED array package, in which it is possible to effectively remove tilting of a plurality of light emitting devices and a step between the light emitting devices by using a semiconductor planarizing process, and a method of manufacturing the same.

Hereinafter, various exemplary embodiments of the present invention will be described in detail with reference to the drawings.

Figure 2:
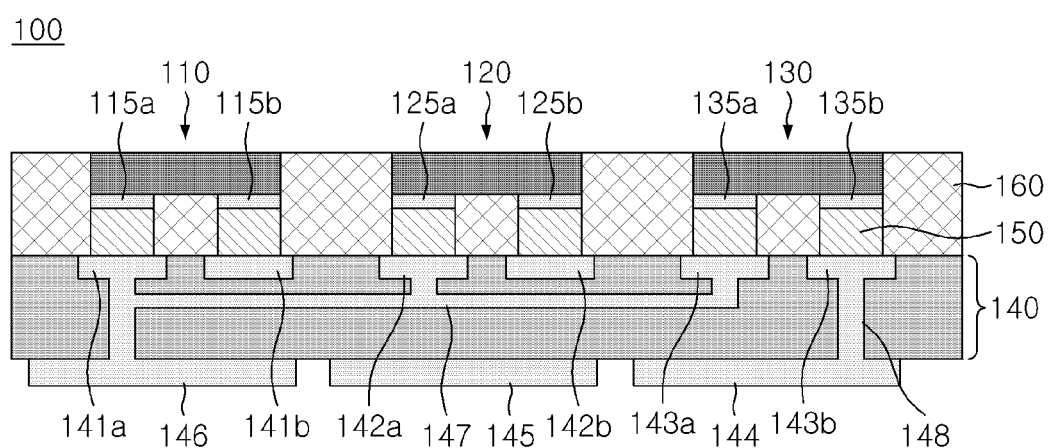
FIG. 2 is a cross-sectional view of the LED array package according to the exemplary embodiment of the present invention.
Figure 3:
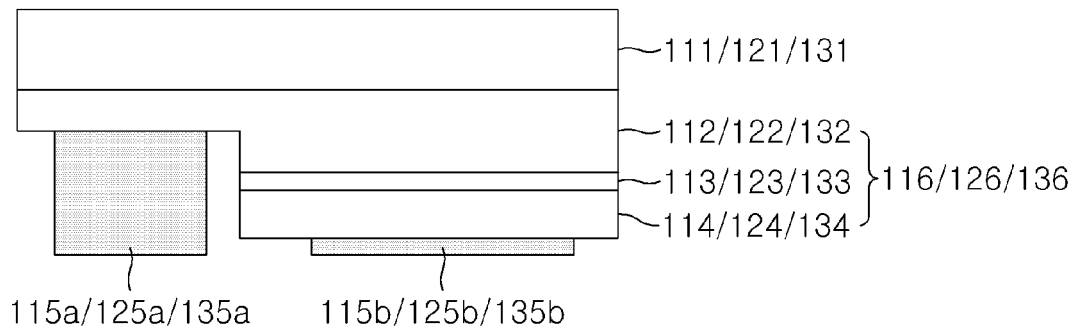
FIG. 3 is a cross-sectional view of a light emitting device according to the exemplary embodiment of the present invention.

FIG. 1 is a top plan view of an LED array package according to an exemplary embodiment of the present invention viewed from the top side, FIG. 2 is a cross-sectional view of the LED array package taken along line X-X' illustrated in FIG. 1, and FIG. 3 is a cross-sectional view of light emitting devices included in the LED array package of FIG. 1.

Referring to FIGS. 1 to 3, an LED array package (or a micro LED matrix array package) 100 according to an exemplary embodiment of the present invention may include a circuit board 140, a plurality of solder balls 150 disposed on the circuit board 140, a plurality of light emitting devices 110 to 130 disposed on the plurality of solder balls 150, and a molding member 160 surrounding the plurality of light emitting devices 110 to 130 and the plurality of solder balls 150.

In the circuit board 140, the plurality of light emitting devices 110 to 130 formed of at least one pixel unit may be mounted. In this case, the plurality of light emitting devices 110 to 130 may be arranged on the circuit board 140 in a predetermined pattern. For example, as illustrated in FIG. 1, the plurality of light emitting devices 110 to 130 may be arranged in a line, but is not essentially limited thereto.

The circuit board 140 may support the plurality of light emitting devices 110 to 130, and discharge heat generated in the plurality of light emitting devices 110 to 130 to the outside. Further, the circuit board 140 may be electrically connected with the plurality of light emitting devices 110 to 130 to serve as a medium for transmitting an electric signal between the plurality of light emitting devices 110 to 130 and an external device (for example, a driver IC). To this end, the circuit board 140 may be provided with a circuit pattern for independently (individually) driving the plurality of light emitting devices 110 to 130.

The circuit board 140 may be formed in a package body (that is, lower surfaces of a molding member and the plurality of solder balls) by applying a System In Package (SIP) technology that is one of the semiconductor process technologies. Accordingly, the circuit board 140 may be formed to have a very small thickness, and simplify the configuration of the circuit pattern for individually driving the plurality of light emitting devices 110 to 130.

The SIP technology used for forming the circuit board 140 in the package body is a comprehensive technology including all of the process/design/manufacturing technologies to integrate all or a substantial portion of the requirements for a single function system, a sub system, and the like into a single package. The SIP is a package type that can secure high performance and an excellent electric characteristic by putting active devices with different functions on a substrate, molding the active devices into one package to secure a short distance of a connection path between the devices.

The circuit pattern formed on the circuit board 140 may be formed of a conductive metal material, such as copper (Cu) or aluminum (Al). The circuit pattern may include first and second connection pads 141*a* and 141*b* electrically connected with first and second conductive metal layers 115*a* and 115*b* of a first light emitting device 110, third and fourth connection pads 142*a* and 142*b* electrically connected with first and second conductive metal layers 125*a* and 125*b* of a second light emitting device 120, fifth and sixth connection pads 143*a* and 143*b* electrically connected with first and second conductive metal layers 135*a* and 135*b* of a third light emitting device 130, a first electrode pad (not illustrated) electrically connected with the second connection pad 141*b*, a second electrode pad 145 electrically connected with the fourth connection pad 142*b*, a third electrode pad 144 electrically connected with the sixth connection pad 143*b*, and a common electrode pad 146 electrically connected with the first connection pad 141*a*, the third connection pad 142*a*, and the fifth connection pad 143*a*. Herein, the first to sixth connection pads 141*a* to 143*b* may be formed on an upper surface (or an upper portion) of the circuit board 140, and the first to third electrode pads 144 and 145 and the common electrode pad 146 may be formed on a lower surface (or a lower portion) of the corresponding circuit board 140.

First to fourth connection pattern portions 147 and 148 for the electric connection may be formed between the connection pads 141*a* to 143*b* disposed on the upper surface of the circuit board 140 and the electrode pads 144, 145, and 146 disposed on the lower surface of the circuit board 140. The first connection pattern portion 147 may be disposed between the first connection pad 141*a*, the third connection pad 142*a*, and the fifth connection pad 143*a*, and the common electrode pad 146 to electrically connect the connection pads 141*a*, 142*a*, and 143*a* and the common electrode pad 146. The second connection pattern portion (not illustrated) may be disposed between the second connection pad 141*b* and the first electrode pad to electrically connect the second connection pad 141*b* and the first electrode pad. The third connection pattern portion (not illustrated) may be disposed between the fourth connection pad 142*b* and the second electrode pad 145 to electrically connect the fourth connection pad 142*b* and the second electrode pad 145. The fourth connection pattern portion 148 may be disposed between the sixth connection pad 143*b* and the third electrode pad 144 to be formed to electrically connect the sixth connection pad 143*b* and the third electrode pad 144.

As described above, the circuit pattern formed in the circuit board 140 may include a common electrode pattern for commonly connecting the first conductive metal layers 115*a* to 135*a* of the plurality of light emitting devices 110 to 130. The common electrode pattern may be formed of the first connection pad 141*a*, the third connection pad 142*a*, the fifth connection pad 143*a*, the first connection pattern portion 147, and the common electrode pad 146.

The circuit board 140 according to the present invention is provided with the common electrode pattern formed through the SIP technology to simplify the configuration of the circuit pattern for individually driving the plurality of light emitting devices 110 to 130.

In the meantime, the circuit board 140 may be formed of a plurality of contact layers through a semiconductor process. Each contact layer may include a metal pattern layer electrically connected with the plurality of solder balls 150 exposed from the molding member 160, and an insulating layer disposed while being adjacent to the metal pattern layer. The metal pattern layer of at least one contact layer among the plurality of contact layers may include the common electrode pattern for commonly connecting the plurality of light emitting devices 110 to 130.

The plurality of solder balls (or the plurality of bumps) 150 may be formed on upper portions of the connection pads 141*a*, 141*b* 142*a*, 142*b*, 143*a*, and 143*b* disposed on the upper surface of the circuit board 140, respectively. The plurality of solder balls 150 is a dedicated solder accessory for electrically and mechanically connecting the circuit board 140 and the plurality of light emitting devices 110 to 130, and is a conductive solder material enabling a transmission of an electric signal between the circuit board 140 and the plurality of light emitting devices 110 to 130. For example, the solder ball 150 may be formed of an alloy of tin, lead (Pb), silver (Ag), copper (Cu), nickel (Ni), germanium (Ge), and bismuth (Bi) or be a smokeless solder ball including no lead (Pb), but is not essentially limited thereto.

The plurality of light emitting devices (or the plurality of LED chips) 110 to 130 may be disposed on the upper portions of the plurality of solder balls 150, respectively, and may be flip-chip bonded through the solder balls 150 to be mounted onto the circuit board 140. In this case, the first and second conductive metal layers 115*a* to 135*b* formed on the lower portion of the light emitting devices 110 to 130 may be disposed so as to face the solder balls 150 disposed on the upper portions of the first to sixth connection pads 141*a* to 143*b* formed on the circuit board 140.

The light emitting surfaces (that is, the upper surfaces) of the light emitting devices 110 to 130 mounted onto the circuit board 140 may be formed be located on the same horizontal surface as the light emitting surfaces (that is, the upper surfaces) of the adjacent light emitting devices 110 to 130. That is, the plurality of light emitting devices 110 to 130 may be formed so as not to be inclined on the circuit board 140 or may be formed so that a predetermined step is not generated between the plurality of light emitting devices 110 to 130. To this end, in a process of manufacturing the LED array package, a process of sequentially forming the plurality of light emitting devices 110 to 130, the plurality of solder balls 150, and the molding member 160 on a transparent plate member (not illustrated), and then grinding and polishing the solder balls 150 and the molding member 160 is required, which will be described in detail below.

The light emitting devices 110 to 130 mounted onto the circuit board 140 may be formed in a small size of 100 μm or less. Further, the plurality of light emitting devices 110 to 130 mounted onto the circuit board 140 may be a light emitting device of a flip-chip type.

For example, as illustrated in FIG. 3, the light emitting devices 110 to 130 may include base substrates 111 to 131, first conductive semiconductor layers 112 to 132 under the base substrates 111 to 131, active layers 113 to 133 under the first conductive semiconductor layers 112 to 132, second conductive semiconductor layers 114 to 134 under the active layers 113 to 133, second conductive metal layers 115*b* to 135*b* under the second conductive semiconductor layers 114 to 134, and first conductive metal layers 115*a* to 135*b* under the first conductive semiconductor layers 112 to 132, respectively. Hereinafter, in the present specification, light emitting structures including the first conductive semiconductor layers 112 to 132, the active layers 113 to 133, and the second conductive semiconductor layers 114 to 134 are referred to as "semiconductor laminated layers 116 to 136". Each of the light emitting devices 110 to 130 may be mounted onto the circuit board 140 to emit light in an upper direction.

The plurality of light emitting devices 110 to 130 may include a red (R) light emitting device, a green (G) light emitting device, and a blue (B) light emitting device configuring one pixel unit. In the meantime, according to another exemplary embodiment, the plurality of light emitting devices 110 to 130 may also include light emitting devices emitting light of the same wavelength (that is, color).

Each of the light emitting devices 110 to 130 may emit light of different wavelengths according to a composition ratio of a compound semiconductor. For example, in the present exemplary embodiment, the first light emitting device 110 may be a red LED chip emitting light of a red wavelength, the second light emitting device 120 may be a green LED chip emitting light of a green wavelength, and the third light emitting device 130 may be a blue LED chip emitting light of a blue wavelength.

The molding member (or the filling member) 160 may be disposed on the circuit board 140, and may be formed so as to surround the plurality of light emitting devices 110 to 130 and the plurality of solder balls 150. Particularly, the molding member 160 may be formed so as to surround the lateral surface and the lower surface of the plurality of light emitting devices 110 to 130 so that the upper surface (that is, the light emitting surface) of the plurality of light emitting devices 110 to 130 is exposed to the outside.

The molding member 160 may protect the plurality of light emitting devices 110 to 130 from an external environment, external impact, and the like. The molding member 160 may form a body of the LED array package 100 (hereinafter, referred to as a "package body" for convenience of description) together with the circuit board 140.

The molding member 160 may be formed of an epoxy resin, a silicon resin, or the like having excellent light transmission and heat conductivity, but is not essentially limited thereto. Further, the molding member 160 may also additionally include an adhesive material for improving adhesive force between the molding member 160 and the circuit board 140 and adhesive force between the molding member 160 and the plurality of light emitting devices 110 to 130.

The molding member 160 may serve to prevent color interference by light emitted from the adjacent light emitting devices 110 to 130. To this end, the black molding member may be formed on the circuit board 140 by adding a black molding material to an epoxy resin, a silicon resin, or the like.

A thickness of the molding member 160 may be equal to or smaller than a thickness from the base substrate of each of the plurality of light emitting devices 110 to 130 to the circuit board 140. A lower surface of the molding member 160 and a lower surface of the base substrate of each of the plurality of light emitting devices 110 to 130 may be located on the same horizontal surface.

A thickness of the base substrate of each of the plurality of light emitting devices 110 to 130 may be different, and a thickness of the plurality of solder balls 150 may be different, and the thickness from the base substrate of each of the plurality of light emitting devices to the circuit board 140 may be the same. Further, a thickness from the base substrate of each of the plurality of light emitting devices 110 to 130 to the upper surface of the plurality of solder balls 150 may be the same (or uniform).

As described above, the LED array package according to the exemplary embodiment of the present invention effectively removes a tilting problem of the plurality of light emitting devices mounted on the package body and a step problem between the plurality of light emitting devices, thereby improving resolution and high color reproduction of a display panel including the corresponding LED array packages.

Figure 4:
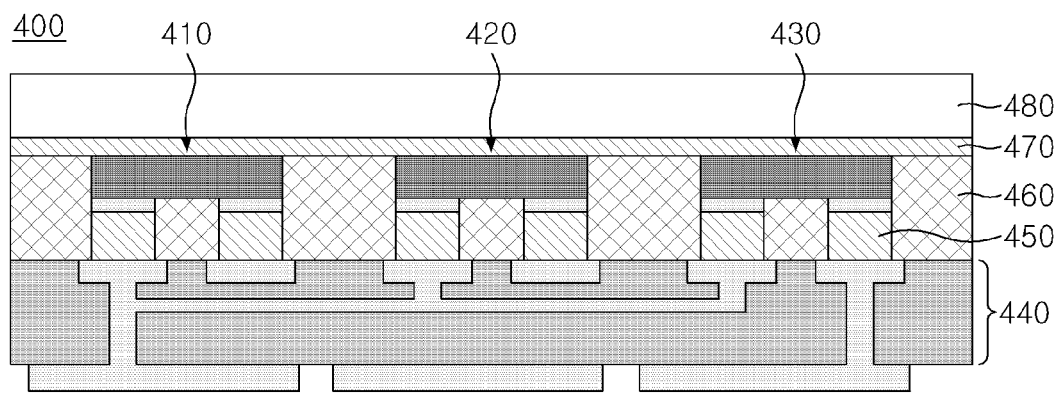
FIG. 4 is a cross-sectional view of an LED array package according to another exemplary embodiment of the present invention.

FIG. 4 is a cross-sectional view of an LED array package according to another exemplary embodiment of the present invention.

Referring to FIG. 4, an LED array package 400 according to another exemplary embodiment of the present invention may include a circuit board 440, a plurality of solder balls 450 disposed on the circuit board 440, a plurality of light emitting devices 410 to 430 disposed on the plurality of solder balls 450, a molding member 460 surrounding the plurality of light emitting devices 410 to 430 and the plurality of solder balls 450, an adhesive member 470 on the molding member 460, and a transparent plate member 480 on the adhesive member 470.

The circuit board 440, the plurality of solder balls 450, the plurality of light emitting devices 410 to 430, and the molding member 460 of the LED array package 400 according to the present exemplary embodiment are the same as or similar to the circuit board 140, the plurality of solder balls 150, the plurality of light emitting devices 110 to 130, and the molding member 160 of the LED array package 100 illustrated in FIG. 2, so that detailed descriptions thereof will be omitted. Accordingly, hereinafter, the LED array package 400 will be described based on the adhesive member 470 and the transparent plate member 480 formed on the plurality of light emitting devices 410 to 430 and the molding member 460.

The plurality of light emitting devices 410 to 430 to 430 may be disposed on an upper portion of the plurality of solder balls 450, respectively, and may be flip-chip bonded through the solder balls 450 to be mounted onto the circuit board 440. Light emitting surfaces (that is, upper surfaces) of the light emitting devices 410 to 430 mounted onto the circuit board 440 may be formed to be located on the same horizontal surface as the light emitting surfaces (that is, the upper surfaces of the adjacent light emitting devices 410 to 430). To this end, in a process of manufacturing the LED array package, a process of sequentially forming the plurality of light emitting devices 410 to 430 to 430, the plurality of solder balls 450, and the molding member 460 on the transparent plate member (not illustrated), and then grinding and polishing the solder balls 450 and the molding member 460 is required, which will be described in detail below.

The adhesive member (or the adhesive sheet 470) is disposed between the transparent plate member 480 and the plurality of light emitting devices 410 to 430 and the molding member 460 to bond the light emitting devices 410 to 430 and the molding member 460 to the transparent plate member 480. In this case, the adhesive member 470 may be formed to be detachable from the plurality of light emitting devices 410 to 430 to 430 and the molding member 460.

The adhesive member 470 may be formed in a shape corresponding to a general shape of the transparent plate member 480. An upper surface of the adhesive member 470 may be disposed so as to face a lower surface of the transparent plate member 480, and a lower surface of the adhesive member 470 may be disposed so as to face upper surfaces of the plurality of light emitting devices 410 to 430 to 430 and the molding member 460.

The adhesive member 470 may be formed of a transparent material so that light emitted from the plurality of light emitting devices 410 to 430 to 430 may be easily transmitted. Further, the adhesive member 470 may include a barrier metal or a bonding metal. For example, the adhesive member 470 may also be formed of a layer including any one or two or more of Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2O, Cu—Zn, Cu—P, Ni—P, Ni—Mn—Pd, Ni—P, and Pd—Ni. As a more preferable exemplary embodiment, the adhesive member 470 may be formed of a silicon material.

The transparent plate member 480 may be disposed at the topmost end of the LED array package 400 to serve to protect the plurality of light emitting devices 410 to 430 to 430 from external impact, an external environment, and the like. Further, the transparent plate member 480 may serve to provide a flat surface for supporting the plurality of light emitting devices 410 to 430 to 320 and the molding member 460 during a process of manufacturing the LED array package 400.

The transparent plate member 480 may allow light emitted from the plurality of light emitting devices 410 to 430 to 430 to be transmitted to the outside. To this end, the transparent plate member 480 may be formed of a transparent material so that light emitted from the plurality of light emitting devices 410 to 430 to 430 may be easily transmitted. For example, the transparent plate member 480 may be formed of a glass material, an acryl material, and the like having excellent light transmission and flatness, but is not essentially limited thereto.

As described above, the LED array package according to another exemplary embodiment of the present invention effectively removes a tilting problem of the plurality of light emitting devices mounted on the circuit board and a step problem between the plurality of light emitting devices, thereby improving resolution and high color reproduction of a display panel including the corresponding LED array packages.

FIGS. 5A to 5I are diagrams illustrating a method of manufacturing an LED array package according to an exemplary embodiment of the present invention.

Figure 5A:

Referring to FIGS. 5A and 5B, a transparent plate member 510 having a predetermined thickness and high flatness may be provided. The transparent plate member 510 may be formed of a glass material, an acryl material, and the like having excellent light transmission and adhesiveness, but is not essentially limited thereto.

An attachable adhesive member 520 may be disposed on an upper surface of the transparent plate member 510. The adhesive member 520 may be formed in a shape corresponding to a general shape of the transparent plate member 510. Further, the adhesive member 520 may be formed of a transparent material so that light emitted from a plurality of light emitting devices is easily transmitted.

Figure 5D:
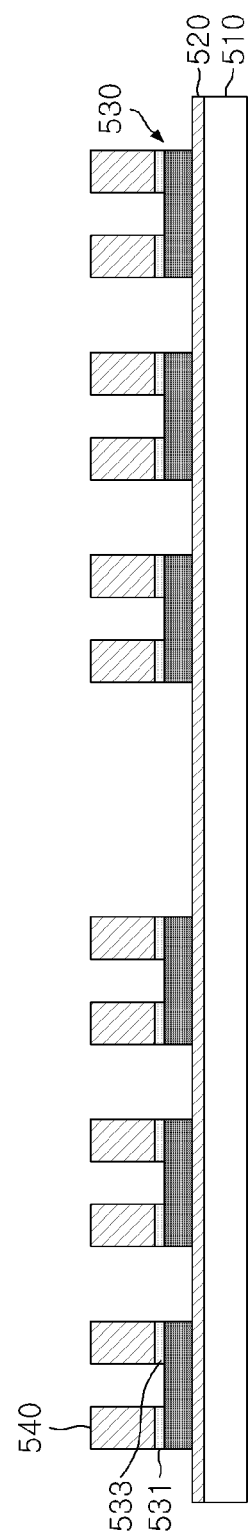

Referring to FIGS. 5C and 5D, the plurality of light emitting devices 530 may be arranged on an upper surface of the adhesive member 520. In this case, the plurality of light emitting devices 530 may be disposed so that the upper surface of the adhesive member 520 faces a light emitting surface of the plurality of light emitting devices 530.

The plurality of light emitting devices 530 may be arranged on the adhesive member 520 in a lattice form or a matrix form. Further, the plurality of light emitting devices 530 may be arranged on the adhesive member 520 in a pixel unit. For example, as illustrated in the drawing, three light emitting devices configuring one pixel unit may be arranged on the adhesive member 520 in a line, and three light emitting devices having the same arrangement may be repeatedly arranged in an adjacent region. Herein, the three light emitting devices configuring one pixel unit may be a red (R) light emitting device, a green (G) light emitting device, and a blue (B) light emitting device emitting light of different wavelengths. In the meantime, in another exemplary embodiment, the three light emitting devices configuring one pixel unit may also be the light emitting devices emitting light having the same wavelength (that is, color).

Then, the solder ball 540 may be disposed each on first and second conductive metal layers 531 and 533 of the plurality of light emitting devices 530. In this case, each solder ball 540 may be formed so as to be laminated from upper surfaces of the first and second conductive metal layers 531 and 533 by a predetermined height or more. The solder ball 540 is a conductive solder material for electrically and mechanically connecting the circuit board and the plurality of light emitting devices, and may be formed of an alloy of tin, lead (Pb), silver (Ag), copper (Cu), nickel (Ni), germanium (Ge), bismuth (Bi), and the like.

Figure 5E:
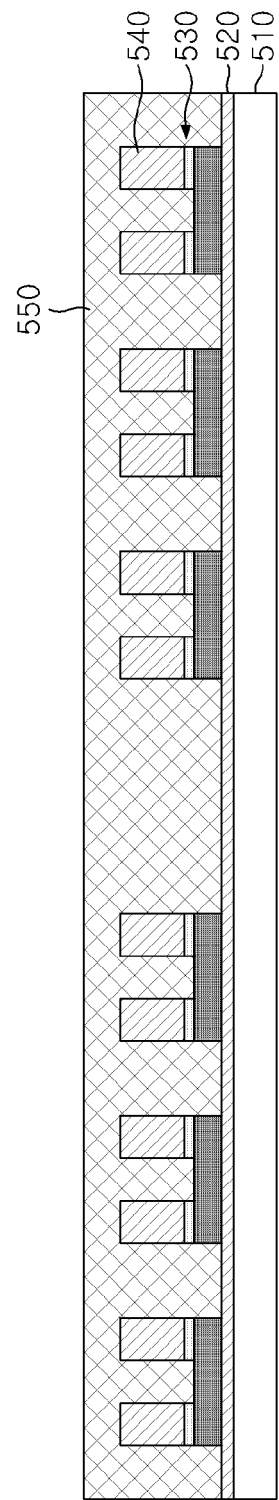
Figure 5F:
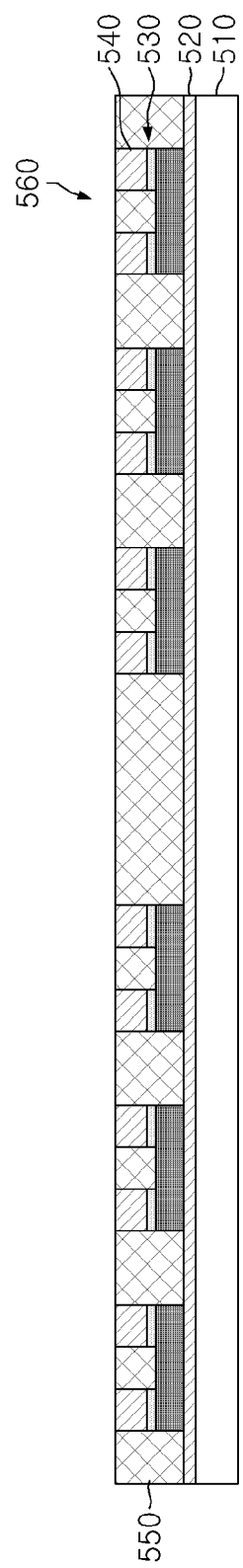

Referring to FIGS. 5E and 5F, a molding member 550 may be formed on the adhesive member 520 on which the plurality of light emitting devices 530 is arranged in the predetermined form. In this case, the molding member 550 may be formed on the transparent plate member 510 to which the adhesive member 520 is attached by using an appropriate molding method, for example, injection molding or transfer molding. Further, the molding member 550 may be formed of an epoxy resin, a silicon resin, or the like having excellent light transmission and heat conductivity.

The molding member 550 may be formed so as to surround the entirety of the plurality of light emitting devices 530 and the plurality of solder balls 540, as well as the entire upper surface of the adhesive member 520. For example, as illustrated in the drawing, the molding member 550 may be formed so that a height from the upper surface of the adhesive member 520 to an upper surface of the molding member 550 is larger than a height from the upper surface of the adhesive member 520 to the upper surface of the plurality of solder balls 540.

Then, the molding member 550 may be planarized by thinly grinding the upper surface of the molding member 550 formed on the transparent plate member 510 by using a grinding and polishing process, such as Chemical Mechanical Polishing (CMP). The grinding and polishing process may be continuously performed up to a height at which a predetermined area or more of the plurality of solder balls 540 is exposed. A first light emitting structure 560 having a predetermined thickness may be formed through the grinding and polishing process, and the first light emitting structure 560 may improve the degree of flatness of the plurality of light emitting devices 530 disposed on the transparent plate member 510. That is, in order to prevent a predetermined step from being generated between the plurality of light emitting devices 530 mounted onto the transparent plate member 510, the light emitting surfaces of the light emitting devices 530 may be formed to be located on the same horizontal surface.

Figure 5H:
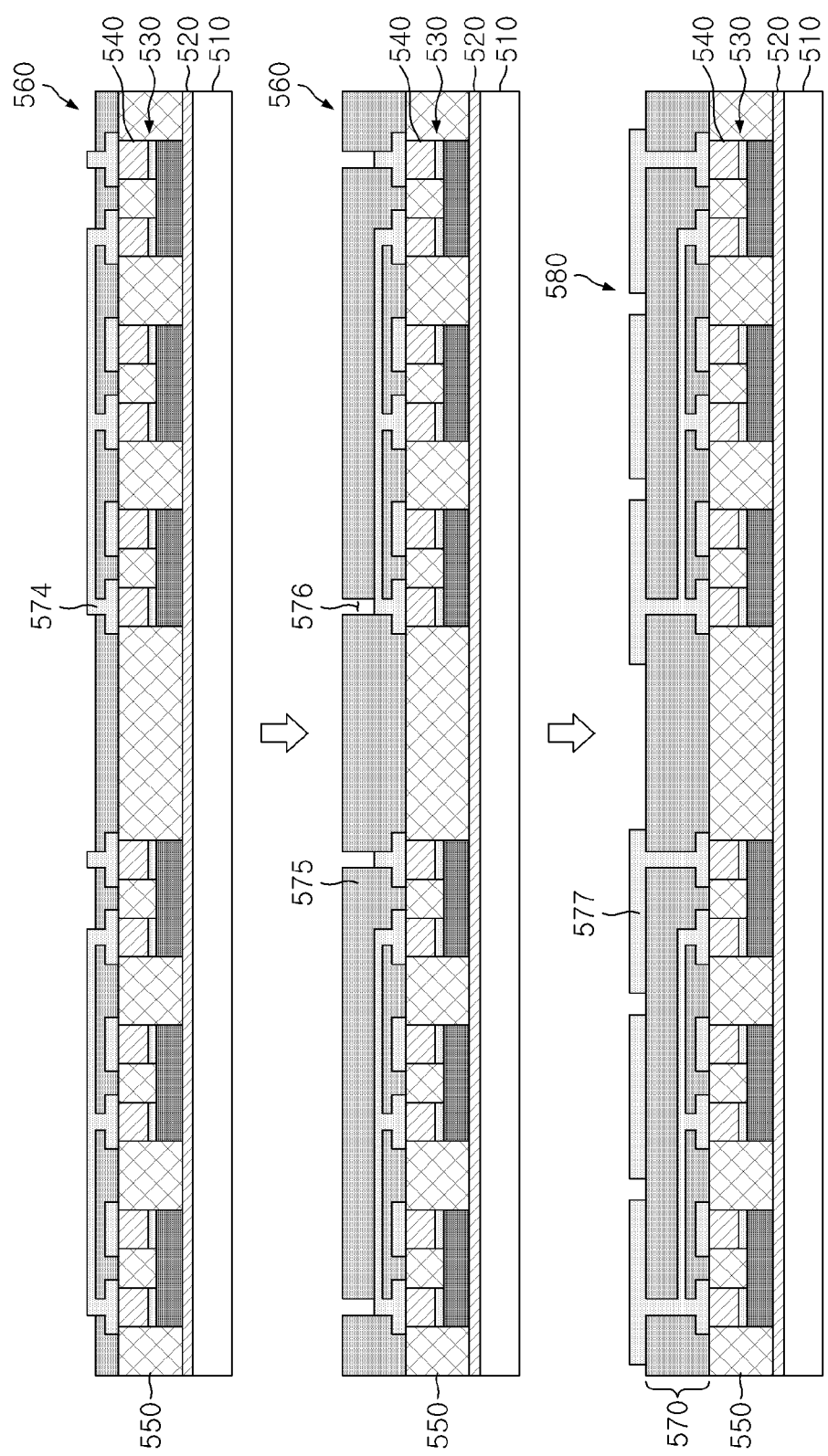

Referring to FIGS. 5G and 5H, a second light emitting structure 580 may be formed by laminating a circuit board 570 having a predetermined circuit pattern on an upper surface of the first light emitting structure 560 planarized through the grinding and polishing process.

The circuit board 570 may be formed on the upper surface of the first light emitting structure 560 by applying the SIP technology that is one of the semiconductor process technologies. The circuit board 570 may be formed by a method of depositing a conductive metal material and a dielectric in different patterns for each layer.

More particularly, a first metal pattern layer 571 may be formed on the upper surface of the plurality of solder balls 540 in the upper surface of the first light emitting structure 560. That is, the first metal pattern layer 571 may be formed by forming a mask layer on the upper surface of the first light emitting structure 560 and depositing a metal on the mask layer, or the first metal pattern layer 571 may be formed by forming a metal layer by depositing a metal on the entire upper surface of the light emitting structure 560 and then performing etching by using a mask. Before the deposition of the metal for forming the first metal pattern layer 571, in order to enhance adhesive force between the first light emitting structure 560 and the deposited metal, $O_2$ plasma processing may be performed on a surface of the first light emitting structure 560.

When the first metal pattern layer 571 is completely formed, a first insulation layer (or a first dielectric layer) 572 may be formed on the first light emitting structure 560 and the first metal pattern layer 571. The first insulation layer 572 is combined with the first metal pattern layer 571 to form a first contact layer.

When the first insulation layer 572 is completely formed, a plurality of first via holes 573 may be formed in the first insulation layer 572. The first via holes 573 may be formed through a lithography process using photosensitive polyimide (PSPI).

When the first via holes 573 are completely formed, a second metal pattern layer 574 may be formed on the first metal pattern layer 571 and the first insulation layer 572 by using the same method as the foregoing method. Then, a second insulation layer 575 may be formed on the first insulation layer 572 and the second metal pattern layer 574. The second insulation layer 575 is combined with the second metal pattern layer 574 to form a second contact layer.

When the second insulation layer 575 is completely formed, a plurality of second via holes 576 may be formed in the second insulation layer 575. Similarly, the second via holes 576 may be formed through a lithography process using photosensitive polyimide (PSPI).

When the second via holes 576 are completely formed, a third metal pattern layer 577 may be formed on the second metal pattern layer 574 and the second insulation layer 575 by using the same method as the foregoing method. The circuit board 570 may be manufactured through the process of sequentially generating the first to third metal pattern layers 571, 574, and 577 and the first and second insulation layers 572 and 575.

The circuit board 570 may be formed of the plurality of contact layers through the foregoing semiconductor process. Each contact layer may include a metal pattern layer electrically connected with the plurality of solder balls 540 exposed from the molding member 550, and an insulating layer disposed while being adjacent to the metal pattern layer. The metal pattern layer of at least one contact layer among the plurality of contact layers may include a common electrode pattern for commonly connecting the plurality of light emitting devices 530.

The circuit board 570 may be formed to have a very small thickness through the semiconductor process. Further, the circuit board 570 may maximally simplify the configuration of the circuit pattern for individually driving the plurality of light emitting devices 530.

The circuit pattern formed in the circuit board 570 may include connection pads disposed on a lower surface of the circuit board 570 and electrically connected with the first and second conductive metal layers 531 and 533 of the plurality of light emitting devices 530, electrode pads disposed on the upper surface of the circuit board 570 and electrically connected with an external device, and connection pattern portions for an electric connection between the connection pads and the electrode pads. Herein, the electrode pads may include a common electrode pad for commonly connecting the connection pads electrically connected with the first conductive metal layers 531 of the plurality of light emitting devices 530, and electrode pads for individually connecting the connection pads electrically connected with the second conductive metal layers 533 of the plurality of light emitting devices 530.

Last, referring to FIG. 5I, after inverting the second light emitting structure 580 up and down, a third light emitting structure 590 may be formed by removing the transparent plate member 510 and the adhesive member 520 disposed on the inverted second light emitting structure 580. When the transparent plate member 510 and the adhesive member 520 are removed from the second light emitting structure 580, a light interference effect by the transparent plate member 510 and the adhesive member 520 is decreased, thereby improving light extraction efficiency of the plurality of light emitting devices 530.

A plurality of LED array packages may be manufactured by separating the third light emitting structure 590 formed as described above into unit package regions through a package separation process. The package separation process may include, for example, a braking process of separating the package by applying physical force by using a blade, a laser scribing process of separating the package by emitting a laser to a boundary of each package, an etching process of separating the package by using wet etching or dry etching, and the like, but is not limited thereto.

In the meantime, in another exemplary embodiment, a plurality of LED array packages may also be manufactured by inverting the second light emitting structure 580 up and down and separating the inverted second light emitting structure 580 into unit package regions through the package separation process without a need to remove the transparent plate member 510 and the adhesive member 520.

Figure 6A:
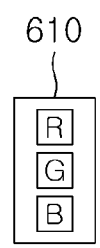
FIGS. 6A to 6C is a diagram illustrating examples of LED array packages including various pixel arrangement structures.
Figure 6B:
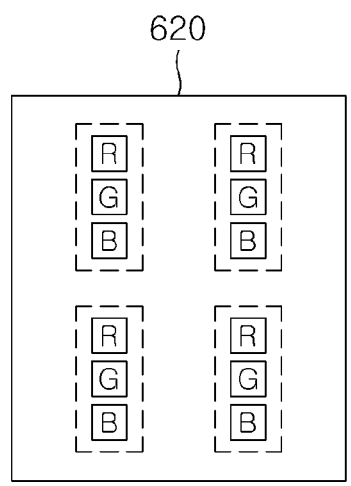
Figure 6C:
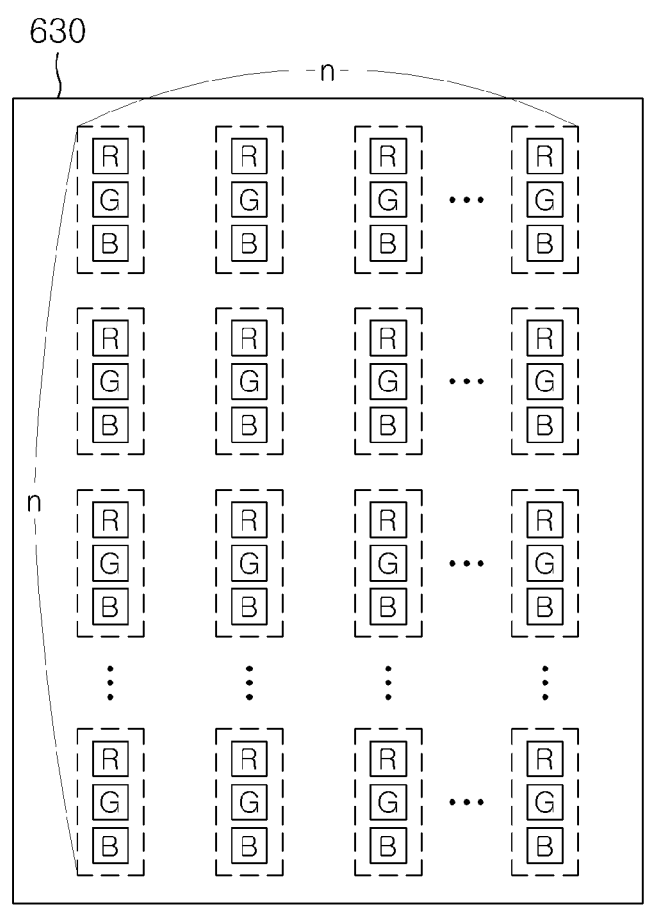

The plurality of LED array packages according to the present invention may be formed to have various pixel arrangement structures according to a use purpose, usage, and the like of a display panel. For example, as illustrated in FIG. 6A, an LED array package (an LED array package having a 1×1 arrangement structure) 610 formed of one pixel (=12) may be manufactured. Further, as illustrated in FIG. 6B, an LED array package (an LED array package having a 2×2 arrangement structure) 620 formed of four pixels (=22) may be manufactured. Further, as illustrated in FIG. 6C, an LED array package (an LED array package having an n×n arrangement structure) 630 formed of nn pixels may be manufactured.

As described above, in the present invention, the plurality of light emitting devices, the plurality of solder balls, and the molding member are sequentially formed on the transparent plate member, and then the LED array packages 100 and 400 are manufactured by using the process of planarizing (that is, grinding and polishing) the solder balls and the molding member in a predetermined thickness, so that it is possible to effectively prevent the plurality of light emitting devices mounted onto the circuit board or the package body from being slantly disposed or a predetermined step from being generated between the plurality of light emitting devices.

In the present invention, the LED array package formed so that the light emitting surfaces of the plurality of light emitting devices mounted onto the package body are located on the same horizontal surface is manufactured, so that it is possible to improve resolution and high color reproduction of a display panel including the corresponding LED array packages.

In the meantime, in the foregoing, the particular exemplary embodiments of the present invention have been described, but may be variously modified without departing from the scope of the invention as a matter of course. Accordingly, the scope of the present invention is not limited to the exemplary embodiment, and should be defined by the matters equivalent to the claims, as well as the claims to be described below.

What is claimed is:

1. A method of manufacturing a micro light emitting diode (LED) matrix array package, the method comprising:
    arranging, a plurality of light emitting devices including a base substrate and a semiconductor laminated layer formed on the base substrate, on an adhesive member attached to an upper surface of a transparent plate member;
    forming a plurality of solder balls on the semiconductor laminated layers of the light emitting devices;
    forming a molding member on the adhesive member so as to surround lateral surfaces and upper surfaces of the light emitting devices and the solder balls; and
    performing a planarizing process of grinding or polishing upper portions of the molding member and the plurality of solder balls,
    wherein the planarizing process is performed so that the upper surfaces of the solder balls are exposed from the molding member, and a thickness from the base substrate of each of the plurality of light emitting devices to an upper surface of each of the exposed solder balls is the same each other, and
    wherein the performing of the planarizing process is repeatedly performed up to a height at which the upper surface of the plurality of solder balls is exposed by a predetermined area.

2. The method of claim 1, further comprising:
    forming a circuit board on the upper portions of the molding member and the plurality of solder balls planarized through the grinding or polishing process.

3. The method of claim 2, wherein the forming of the circuit board includes forming a contact layer including a metal pattern layer electrically connected with the plurality of solder balls exposed from the molding member and an insulation layer adjacently disposed to the metal pattern layer.

4. The method of claim 3, wherein the forming of the circuit board includes forming a plurality of contact layers by repeatedly performing the contact layer forming process.

5. The method of claim 4, wherein in the forming of the circuit board, the metal pattern layer of at least one contact layer among the plurality of contact layers includes a common electrode pattern for commonly connecting the plurality of light emitting devices.

6. The method of claim 1, further comprising:
    removing an adhesive member and a transparent plate member attached to lower surfaces of the molding member and the plurality of light emitting devices.

7. The method of claim 1, wherein in the forming of the molding member, a height from an upper surface of the adhesive member to an upper surface of the molding member is larger than a height from the upper surface of the adhesive member to an upper surface of each of the solder balls.

8. The method of claim 1, wherein the performing of the planarizing process includes grinding or polishing upper portions of the molding member and the plurality of solder balls using a Chemical Mechanical Polishing (CMP) process.

9. A method of manufacturing a micro light emitting diode (LED) matrix array package, the method comprising:
    arranging, a plurality of light emitting devices including a base substrate and a semiconductor laminated layer formed on the base substrate, on an adhesive member attached to an upper surface of a transparent plate member;
    forming a plurality of solder balls on the semiconductor laminated layers of the light emitting devices;
    forming a molding member on the adhesive member so as to surround lateral surfaces and upper surfaces of the light emitting devices and the solder balls;
    performing a planarizing process of grinding or polishing upper portions of the molding member and the plurality of solder balls; and
    removing an adhesive member and a transparent plate member attached to lower surfaces of the molding member and the plurality of light emitting devices,
    wherein the planarizing process is performed so that the upper surfaces of the solder balls are exposed from the molding member, and a thickness from the base substrate of each of the plurality of light emitting devices to an upper surface of each of the exposed solder balls is the same each other.

10. The method of claim 9, further comprising:
    forming a circuit board on the upper portions of the molding member and the plurality of solder balls planarized through the grinding or polishing process.

11. The method of claim 10, wherein the forming of the circuit board includes forming a contact layer including a metal pattern layer electrically connected with the plurality of solder balls exposed from the molding member and an insulation layer adjacently disposed to the metal pattern layer.

12. The method of claim 11, wherein the forming of the circuit board includes forming a plurality of contact layers by repeatedly performing the contact layer forming process.

13. The method of claim 12, wherein in the forming of the circuit board, the metal pattern layer of at least one contact layer among the plurality of contact layers includes a common electrode pattern for commonly connecting the plurality of light emitting devices.

14. The method of claim 9, wherein in the forming of the molding member, a height from an upper surface of the adhesive member to an upper surface of the molding member is larger than a height from the upper surface of the adhesive member to an upper surface of each of the solder balls.

15. The method of claim 9, wherein the performing of the planarizing process includes grinding or polishing upper portions of the molding member and the plurality of solder balls using a Chemical Mechanical Polishing (CMP) process.

* * * * *

UNITED STATES PATENT AND TRADEMARK OFFICE
CERTIFICATE OF CORRECTION

| | | |
|---|---|---|
| PATENT NO. | : 11,289,633 B2 | Page 1 of 1 |
| APPLICATION NO. | : 16/690061 | |
| DATED | : March 29, 2022 | |
| INVENTOR(S) | : Seung Hyun Oh et al. | |

It is certified that error appears in the above-identified patent and that said Letters Patent is hereby corrected as shown below:

On the Title Page

Item [30], insert:
--March 5, 2019 (KR) ................... 10-2019-0025251--

Signed and Sealed this
Twenty-first Day of June, 2022

Katherine Kelly Vidal
*Director of the United States Patent and Trademark Office*